METHOD OF FORMING A COMPOSITE INSULATING LAYER

INVENTORS
JAMES A. CUNNINGHAM
CLYDE R. FULLER
SAMUEL J. WOOD, JR.

BY Gerald B. Epstein
ATTORNEY

METHOD OF FORMING A COMPOSITE INSULATING LAYER

Filed Jan. 19, 1968 3 Sheets-Sheet 2

METHOD OF FORMING A COMPOSITE INSULATING LAYER 3,647,663

METHOD OF FORMING A COMPOSITE INSULATING LAYER

James A. Cunningham, Dallas, and Clyde R. Fuller and Samuel J. Wood, Jr., Plano, Tex., assignors to Texas Instruments Incorporated, Dallas, Tex.

Filed Jan. 19, 1968, Ser. No. 699,169
Int. Cl. C23c *15/00*
U.S. Cl. 204—192 7 Claims

ABSTRACT OF THE DISCLOSURE

Disclosed is a method of forming a composite insulating layer for use, primarily, in multilevel integrated circuits. An RF-sputtered silicon oxide layer is deposited over the first layer contacts of a monocrystalline integrated circuit followed by the deposition of a layer of oxidative silicon oxide resulting from a reaction of silane $SiH_4$ with oxygen $O_2$ to form a composite insulating layer. The composite insulating layer combines the advantage of the silicon oxide layer formed by either method but with none of the disadvantages inherent in either.

This invention relates to semiconductors, especially of the monolithic integrated circuit type, and more particularly relates to a composite insulating layer for multilevel contact systems.

The increased demand of micro-miniaturization has been reflected in the field of electronics by the development of semiconductor integrated circuits or networks, whereby a plurality of active and/or passive circuit components are formed in or on a single slice of semiconductor material, each of the circuit components thereafter being interconnected in a particular manner to provide the desired circuit function. For example, an integrated circuit device of the monolithic type may have a number of transistors and resistors formed by diffusion beneath one face of a slice of semiconductor material, a suitable material being silicon, a protective layer, usually of silicon oxide, upon the face of the wafer, and metallic films upon the protective layer interconnecting the resistors to various regions of the transistors in a desired pattern through apertures in the protective layer. The increasing complexity of circuitry, however, has resulted in a corresponding increase in complexity of the interconnection contact pattern. It has, therefore, become necessary to form more than one level of metallic interconnections requiring adequate electrical insulation or isolation between the various levels of contacts at crossover points and ohmic connection between the various levels through apertures in the insulating layers. This is particularly true when, upon a single slice of semiconductor material, a plurality of separate circuits are formed and it becomes necessary to interconnect the circuits for cooperative action to produce one unitary circuit function.

The materials, of which the metal films and the electrical insulating layers or layer are formed must, in themselves, exhibit favorable chemical, electrical, thermal, and mechanical properties, including compatibility with one another to provide an adequate multilevel contact interconnection system. For example, the metallic film, or films, on the first level should provide low resistance ohmic contact to the semiconductor material and should adhere well to the protective layer upon the face of the slice or wafer. Insulating material between levels of metal films on the other hand, should afford adequate electrical isolation and should be substantially free of pinholes to avoid the possibility of electrical shorting between different levels. In addition, the entire system should be fabricated of metals and insulators, which are hard and structurally strong materials that will not yield or break up during wafer or slice handling and testing; all of the materials should be physically and chemically stable when subjected to high temperatures so that none of the materials will undesirably react with one another or with the semiconductor substrate; the metals and the isolation or insulation medium should tightly adhere to one another and there should be good interlevel ohmic contact between the metallic film of one level and the metallic film of another level at conductive crosspoints.

It is therefore an object of the invention to provide a method of forming a composite insulating layer of minimum pinhole density by forming two insulating layers using two distinctly different deposition processes so that pinhole producing mechanisms are different in each case and so that the pinholes do not overlap.

Another object of the invention is to provide a method of forming a composite insulating layer for semiconductor devices that has good edge covering characteristics.

Another objective of the invention is to provide a method of forming an insulating layer that etches in such a manner as to reproducibly form feedthrough holes which have properly sloped sides.

Still another object of the invention is to provide a method of forming a composite insulating layer for semiconductor devices that adheres well to metal films.

Yet another object of the invention is to provide a method of forming a composite insulating layer for semiconductor devices that can be formed to a sufficient thickness without delamination.

Still yet another object of the invention is to provide a method of forming a composite insulating layer for semiconductor devices that can be deposited on oxidizable metal films, such as molybdenum, without oxidizing such metal films.

In brief, the invention involves the deposition of the same material or materials having substantially the same composition by different methods which produces layers of material having dissimilar mechanical and chemical properties. The illustrated embodiment of the invention involves the deposition of a first layer of silicon oxide on a semiconductor substrate having metal contacts on its surface by conventional RF-sputtering techniques. The RF-sputtered oxide has excellent adherence to the underlying metal contacts; is practically stress free; and is deposited in an argon atmosphere, such that the underlying metal contacts, which are commonly comprised of molybdenum, do not oxidize. A second and somewhat thicker layer of oxidative silicon oxide is deposited upon the RF-sputtered silicon oxide layer by the reaction of tetraothoxysilane $Si(OC_2H_5)_4$ or silane $SiH_4$ with oxygen $O_2$ at atmospheric pressure. The oxidative silicon oxide layer has excellent edge coverage in that the silicon oxide deposits on the sides of the metal contacts. Therefore, by the use of two layers of silicon oxide deposited by different methods, the disadvantages of each type of silicon oxide are minimized and the advantage of each type of silicon oxide are maximized to obtain a composite layer which has excellent properties for use in multilevel contact systems.

The novel features believed to be characteristic of this invention are set forth in the appended claims. The invention itself, however, as well as other objects and advantages thereof, may best be understood by reference to the following detailed description when read in conjunction with the accompanying drawings, wherein:

Figure 1:
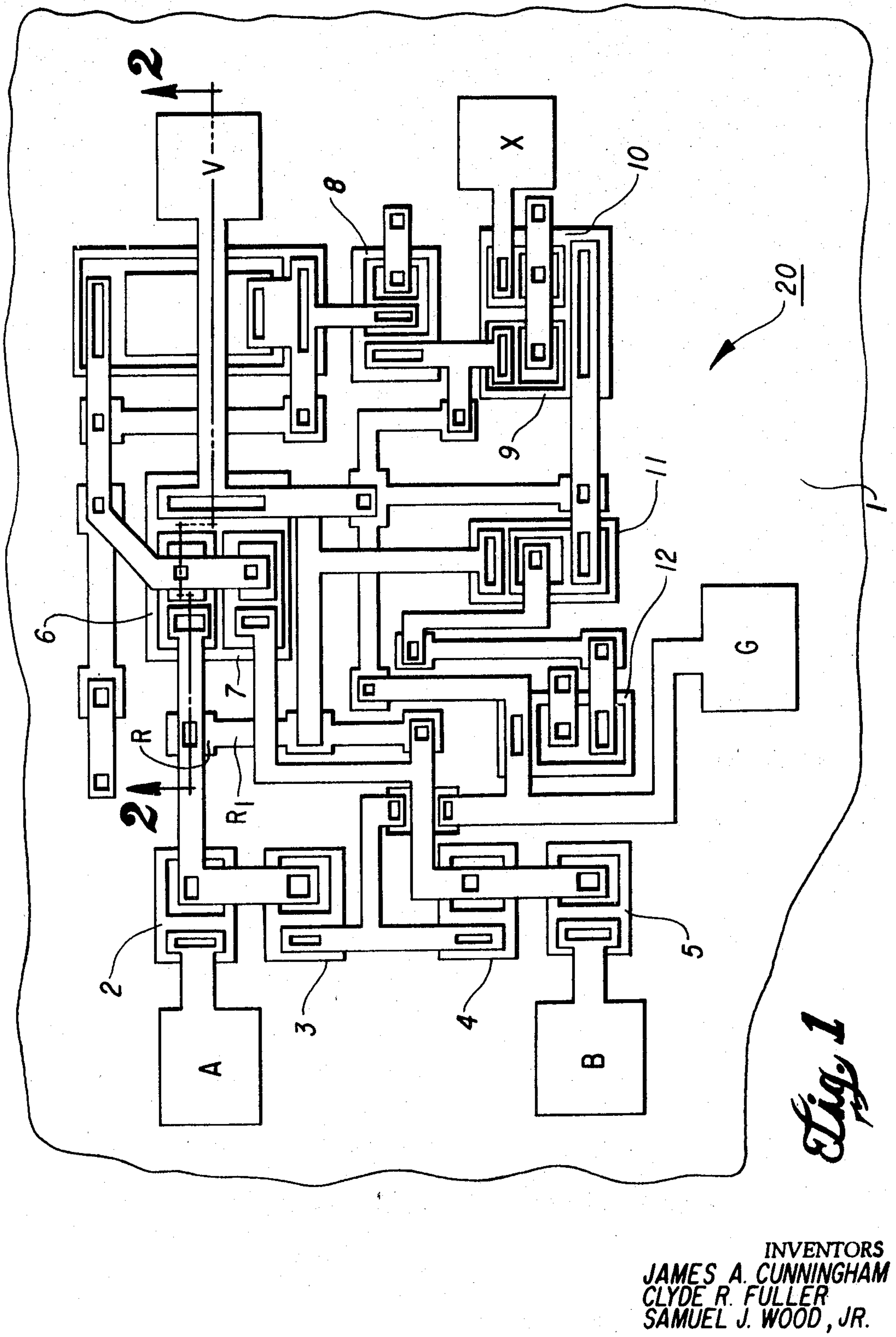
FIG. 1 is a plan view, greatly enlarged, illustrating a layout of circuit components in a typical functional element of a semiconductor integrated circuit.

Referring now to the figures of the drawings, a functional element 20 is shown in FIG. 1 formed in a substrate 1 of semiconductor material, for example, silicon. The functional element 20 contains the necessary number of interconnected circuit components such as transistors, resistors, capacitors, or the like, to produce a desired circuit function. The circuit of the functional element 20 includes the PNP transistor 2, 3, 4 and 5 and the NPN transistors 6, 7, 8, 9, 10, 11 and 12, the three input terminals A, B and X and the output terminal G.

Figure 2:
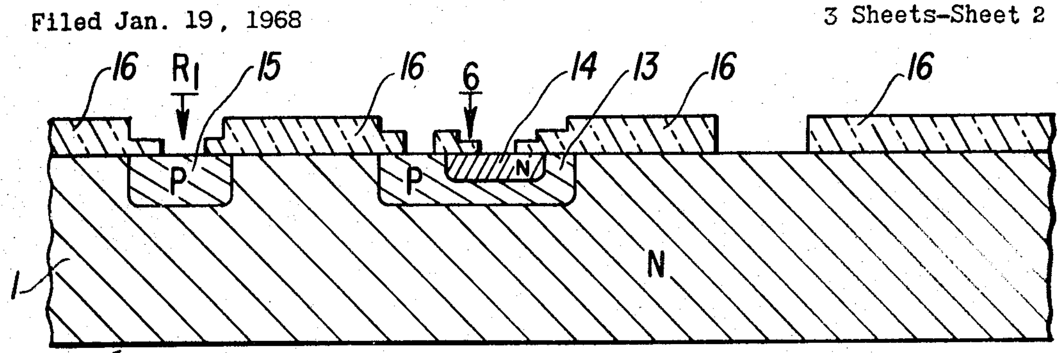
FIGS. 2–4 are sectional views, illustrating a portion of the integrated circuit structure shown in FIG. 1 taken on the section line 2—2, showing subsequent steps in the formation of a multilevel interconnection system, using the composite insulating layer of the invention.

The transistors and other circuit components are formed within or upon the semiconductor substrate 1 by way of the techniques commonly known in the semiconductor art, such as for example, epitaxial growth or diffusion. Thus, looking at the FIG. 2, there is depicted, in section, a portion of the integrated circuit structure of FIG. 1 before the application of any of the metal interconnections. The NPN transistor 6 comprises an N-type collector formed by the substrate 1, the diffused P-type base region 13, and the diffused N-type emitter region 14. The resistor $R_1$ is provided by the P-type diffused region 15, formed simultaneously with the base region 13 of the transistor. A silicon layer oxide 16 on the surface of the substrate is formed by any of the conventional methods, such as thermal growth or pyrolitic deposition, acquiring a step configuration, as shown, due to the successive diffusion operations. Thereafter, apertures or holes are formed in the silicon oxide coating 16 where interconnecting ohmic contacts are to be subsequently made between the first level and second level metallic contacts.

Figure 3:
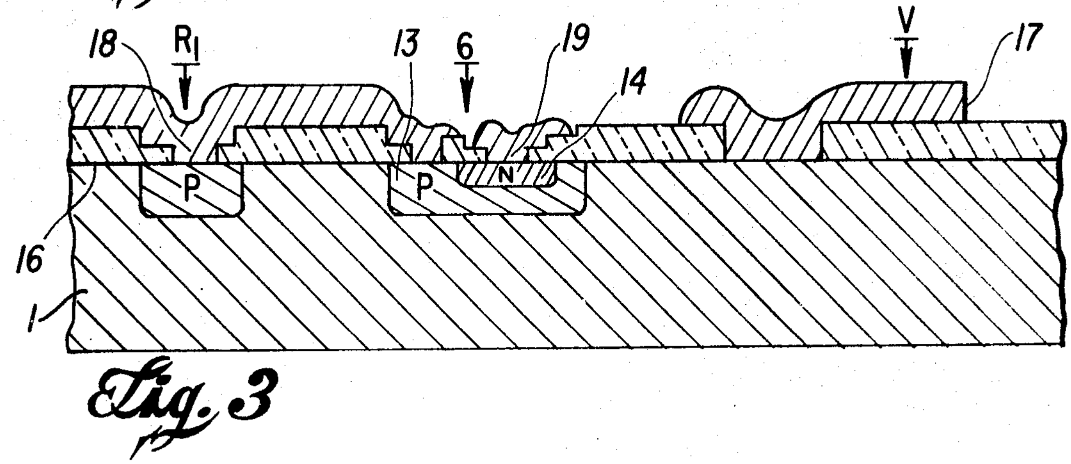

Although a number of metals are commonly used in the electronic industry today to form contact systems for semiconductor devices, a combination layer of molybdenum-gold-molybdenum has been found to give better results than any other single or combination of contact metals to date. The molybdenum-gold-molybdenum contact system is described more particularly in a copending patent application, Ser. No. 606,064, assigned to the assignee of the present patent application. A thin molybdenum layer of about 2,000 A. in thickness is deposited by conventional evaporation or sputtering methods upon the surface of the oxide layer 16 and upon the surface of the substrate 1 exposed by the apertures or holes in the layer 16. A layer of gold of about 8,000 A. in thickness is deposited on the molybdenum layer followed by the deposition of a second layer of bout 2,000 A. in thickness of molybdenum on the layer of gold to form a composite metal film 2. The three layers of metal forming the composite metal film are not differentiated in the figures of the drawings for clarity of illustration. Using conventional photolithographic and etching techniques known in the industry, selective portions of the composite metal film are removed to provide the first level pattern of ohmic contacts and interconnections 17, 18 and 19 as shown in FIG. 3. Metal contact 18 connects the resistor $R_1$ to the base region 13 of the transistor 6. Metal contact 19 makes connection to the emitter region 14 of the transistor 6 and metal contact 17 makes connection to the collector, the substrate 1, of the transisor 6.

The electronic industry has been searching for an insulating layer that would better cover underlying metal layers such as the first metal contacts 17, 18 and 19 so as to completely insulate the first metal contacts from a second level of metal contacts and to allow good ohmic connection to be made between the two metal levels through apertures in the insulating layer. A number of different materials have been investigated as the insulating layer with silicon oxide seemingly the best material for this purpose. In addition, many methods of depositing silicon oxide have been investigated. Each method of deposition has resulted in silicon oxide layers with various advantages and disadvantages.

Silicon oxide layers deposited by RF-sputtering are characterized by excellent adhesion to metal contacts and, of course, to other silicon oxide layers. This characteristic appears to be only weakly dependent upon the deposition conditions, such as substrate temperature, argon pressure and power density. Due to having low stress, silicon oxide layers, therefore, can be applied to extraordinary thicknesses, many microns, for example, on silicon slices without danger of delamination. The layers are relatively pinhole free and nonporous to various acids if applied at high substrate temperatures, 500° C. or above, a condition which arises naturally from plasma heating, RF-eddy currents and other sources during deposition if the slices are not thoroughly heat sinked, but compared to higher pressure deposition methods such as the oxidative oxide method, the metal contact coverage is relatively poor. The top surface of the metal contact is covered very well, but the side surfaces are left practically uncovered so that the thickness of the RF-sputtered silicon oxide layer must be greater than the metal contact thickness to prevent shorting problems at insulated crossovers. This thickness consideration appears to hold true for all low pressure silicon oxide deposition processes, including RF-sputtering.

In order to make ohmic contact between a second level metal film and the first level film with a silicon oxide layer therebetween, an aperture must be etched in the silicon oxide layer. Hydrofluoric acid is the most commonly used acid for this purpose. However, the hydrofluoric acid etch rate of RF-sputtered silicon oxide layers is inversely proportional to the deposition temperature of the substrate. The etch rate of the layer will be braded (fast at the bottom and slow at the surface if the silicon substrate is allowed to gradually increase in temperature as the deposition run proceeds). This graded etch rate produces a feed-through aperture or interlevel contact opening which has a backward or "bell bottom" contour. Since the metal film forming a portion of the second level metal interconnection cannot bridge this reverse contour, unless impractically thick, an open circuit results at the feed-through interconnection.

By thoroughly heat sinking the substrate and maintaining it at some fairly constant temperature, the graded density effect can be minimized, in practice, however, temperatures are limited to the range of about room temperature to about 300° C. Constant temperatures near or above 300° C. are difficult to provide due to lack of suitable heat sinking materials. An improved layer results with greater density and low etch rate, for example, if the substrate is allowed to heat naturally due to the induced plasma to about 600° C. Since a variance in substrate temperature produces graded etch effects, RF-sputtered layers deposited for multilevel applications are usually between 30,000 A. to 60,000 A. in thickness, and deposited at relatively low constant temperatures. If it were possible to deposit layers of silicon oxide at higher constant temperatures, good crossover isolation could be achieved between the metal interconnection with a thinner layer, but efforts to build crossovers with "thinner" low temperature layers have been equally unsuccessful. The problem is additionally complicated by the fact that silicon oxide layers in the thickness range of from about 30,000 A. to 60,000 A. are difficult to etch without photoresistive material undercutting problems.

Silicon oxide layers produced by reaction of either $Si(OC_2H_5)_4$ or $SiH_4$ with $O_2$ are accomplished at atmospheric pressure, and have excellent metal contact edge coverage. In contrast to the silicon oxide layer formed by RF-sputtering, which mainly covers the contact surface facing the material to be sputtered the oxidative silicon oxide layer covers all of the surfaces of the metal contact with a typically low pinhole density. The process is carried out at conveniently low temperatures. The $SiH_4$ reaction, for example, takes place at less than 350° C. However, the oxidative layers are stressed and exhibit only fair adhesion to a metal contact, properties which prevent the use of layers much beyond 5,000 A. in thickness due to cracking and spalling. The oxidative silicon oxide layer does not lend itself to the first covering of a oxidizable material such as molybdenum, since a highly oxidizing atmosphere is present during the silicon oxide deposition. Rather extensive oxidation of the top molybdenum layer occurs together with some attack of the bottom molybdenum layer since the inner layer of gold does not completely cover the bottom molybdenum layer. Molybdenum oxides form that are only partially etchable or only completely etchable with difficulty by conventional acid etches, thus complicating the feed-through hole formation step. In addition, the formation of these oxides is not predictable and cannot be reproduced accurately. Since it is applied at a constant temperature, the oxidative silicon oxide layer has no graded density or variable etch rate effect, so that when the feed-through hole is formed the hole does not have the bell bottom shape as with the RF-sputtered layer, but has concave sides.

Although the RF-sputtered and the oxidative deposited silicon oxide layers are the most commonly used, other methods of depositing silicon oxide are sometimes used with less success than the above mentioned two processes. For example, evaporative layers formed from quartz by the use of an electron beam are sometimes used which have etching characteristics that are not reproducible with typically high pinhole density and poor edge coverage. Shadowing at the metal contact edges are at a maximum with this type of silicon oxide because the evaporant originates from a near point source and travels to the substrate with no appreciable scattering. Layers of silicon oxide can also be obtained by using reactive sputtering processes but the deposition rates are very low.

The invention utilizes the combination of a first RF-sputtered silicon oxide layer and a second oxidative silicon oxide layer to form a composite silicon oxide layer having the advantage of the two separate layers, but with very few of the disadvantages of either. The thickness of the first layer of RF-sputtered layer is kept thin, about 1,000 A. to 3,000 A., in thickness so that there is little graded etch effect. The layer adheres well to the underlying metal contacts with very low stress so that the layer will not spall. The disadvantage of the poor edge covering of the RF-sputtered silicon oxide layer is overcome by the second layer of oxidative silicon oxide. The oxidative silicon oxide layer covers the exposed surfaces of the metal contact remaining after the RF-sputtered layer is formed. The oxidative silicon oxide layer thickness is kept within a range of about 3,000 A. to about 5,000 A., so that no spalling and flaking of the layer occurs.

The second layer adheres well to the previous RF-sputtered silicon oxide. Therefore, by the use of the two layers, a composite silicon oxide layer results that has good adherence to metal contacts and excellent contact edge coverage. The composite layer has no tendency to spall or crack, has no graded etch rate and has none of the disadvantages of a single layer of silicon oxide formed by either method.

Figure 4:
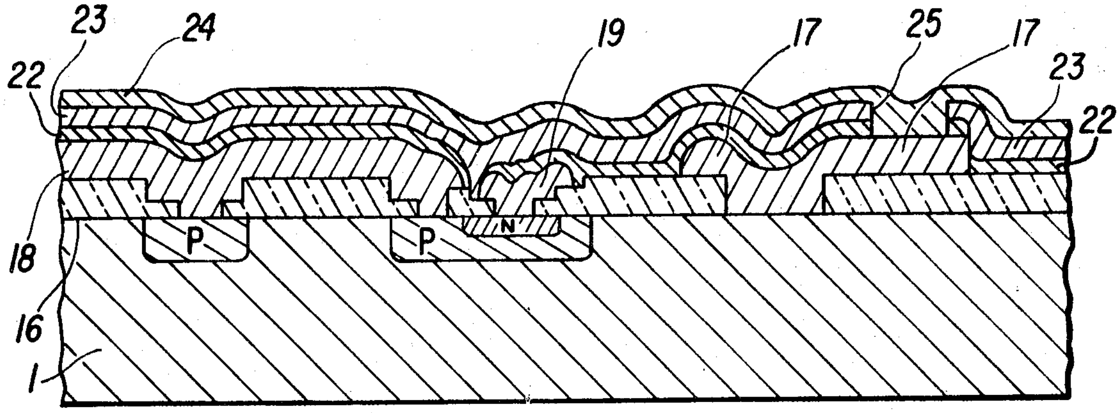
Figure 5:
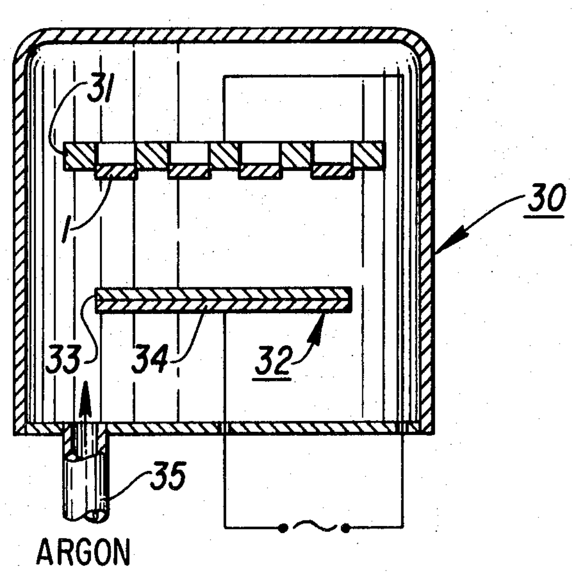
FIG. 5 is a pictorial view, partially in section, illustrating only the most pertinent elements of an apparatus used for RF-sputtering a silicon oxide layer.

To form the first layer 22 of RF-sputtered silicon oxide as shown in FIG. 4, the substrate 1, as shown in FIG. 3, is placed in a conventional RF-sputtering apparatus 30 as shown in FIG. 5. The substrate 1 along with a number of other substrates are held in a substrate support 31 within the apparatus 30, and a sputter plate 32 is placed in close proximity to the substrates with its major surfaces parallel to the major surfaces of the substrates. The sputter plate 32 has a layer 33 of silicon oxide on a metal support plate 34. The metal support plate 34 and the substrate support 31 are conected electrically to a source of RF energy (not shown) outside of the apparatus 30. The substrate support 31 also acts as a heat sink to remove some of the heat that is produced in the substrate during the RF-sputtering operation. Argon, under pressure of about 5 to 15 microns of mercury is introduced through the opening 35 into the apparatus 30. RF energy is applied between the substrate support 31 and the sputter plate 32 at a frequency of about 13 megacycles per second for a sufficient time, about 10 minutes, for example, to form a layer of silicon oxide on the silicon substrate surface having a thickness from about 1,000 A. to about 3,000 A., a thickness of about 2,000 A. being the preferred thickness. When a sufficient thickness of silicon oxide is obtained, the RF energy is removed and the argon gas flow is stopped to allow removal of the substrates from the apparatus 30.

Figure 6:
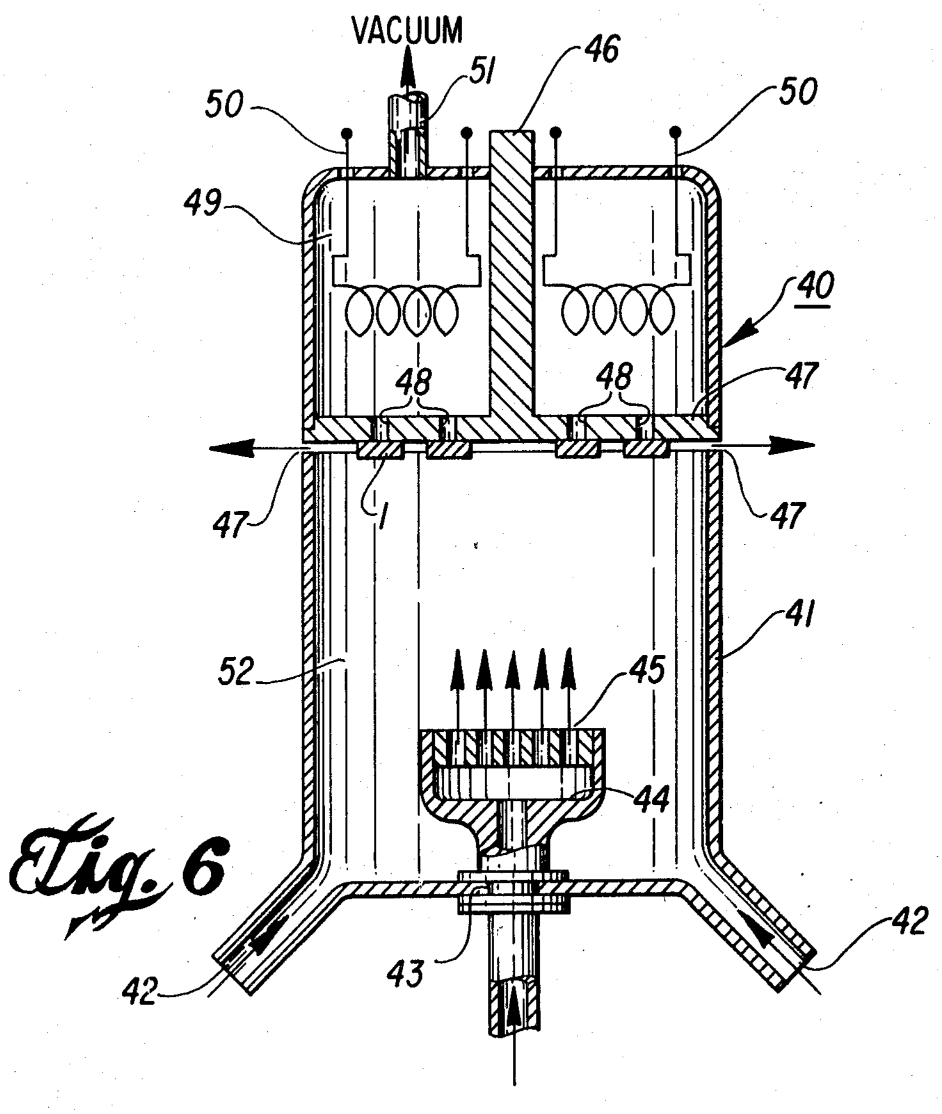
FIG. 6 is a pictorial view, partially in section, illustrating only the most pertinent elements of an apparatus for deposing an oxidative silicon oxide layer formed from the reaction $SiH_4$ and $O_2$.

To form the oxidative silicon oxide film 23 as shown in FIG. 4, the substrate 1 along with other silicon substrates is placed in a reactor 40, as shown in FIG. 6. Although many specific techniques in forming the oxidative silicon oxide layer 18 can be used, a brief description of one method, which is more fully described in a copending patent application Ser. No. 606,177, assigned to the assignee of the present patent application will be described briefly. The lower portion of the reactor is a cylindrically shaped glass container 41 opened at the top and having a plurality of inlets 42 which are evenly spaced around the perimeter of the glass container 41 through which oxygen is allowed to pass. There is an additional inlet 43 in the base of the container 41 through which the neck of a cylindrical dispersion head 44 passes.

The dispersion head 44 has a plurality of holes 45 which serve to allow an even flow of a mixture of helium and silane. Located at the top of the reactor is a cylindrical aluminum shaft 46 attached to a cylindrical aluminum plate 47 located within the upper chamber 49. The plate 47 has a series of openings 48 over which the substrate 1 and other substrates are placed. Consequently, when a vacuum is applied to the chamber 49 by inlet 51, the pressure at the openings 48 in the plate 47 will drop. By means of this pressure drop, substrates are held to the surface of plate 47 over each of the openings 48. Above the plate 47 a series of heaters 50 are dispersed to maintain the temperature of the substrates at a desired level.

During operation, pure silane of the type sold by Mathis & Co., East Rutherford, N.J., for example is carried from an external tank (not shown) to dilute with helium which is used as a carrier gas. The helium-silane mixture is introduced into the lower chamber 52 containing the substrates through holes 45 in the dispersion head 44. Simultaneously therewith, oxygen is introduced into the chamber through the evenly spaced inlets 42. The oxygen and silane flows are directed to the underside of the heated substrates such that when the silane and oxygen reach the substrates they react with each other to cause silicon oxide to deposit on the substrates.

The deposition rates of silicon oxide on the under side of the substrates is primarily related to the gas flow rates and the temperature of the substrates for a given set of reactor dimensions. It has been observed for example, that for a reactor chamber 52 of 6″ in height and 4½″ in diameter, with flow rate of helium of about 4.5 liters per minute, silane of about 7 cc. per minute and oxygen of about 200 cc. per minute, silicon oxide deposits at the rate of about 300 A. to 500 A. per minute.

After the desired thickness of oxidative silicon oxide is formed, the substrates are returned to room temperature and the helium, silane and oxygen flows are turned off, allowing the substrate 1 to be removed from the apparatus.

To prepare the substrate 1 for the second level of interconnections, apertures 25 (only one being shown in FIG. 4) are formed in the composite oxide layer 22 and 23 by conventional photolithographic and etch techniques. A second level of metal interconnections can be formed from any of the common metals used in the industry today. However, a first layer of molybdenum followed by a final protective layer of gold has been found to be the best combination of metals for the final interconnection layer. After the first layer of molybdenum and the second layer of gold have been deposited by conventional techniques on the surface of the silicon oxide layer 23, the two metal layers are etched by conventional photolithographic techniques to form the top metal layer 24, as shown in FIG. 4. For clarity of illustration the different metal layers of metal layer 24 are not differentiated. In very complex circuitries, where more than two levels of metal interconnectios are desired, the second metal layer 24, instead of being composed of a layer of molybdenum and gold, can be composed of molybdenum-gold-molybdenum as was the first level comprising the metal contacts 17, 18 and 19.

While the invention of the composite silicon oxide layer has been described in conjunction with multilevel integrated circuits, the composite oxide layer is usde to advantage as the final protective layer on individual devices.

Although the preferred embodiment of the invention has been described in detail, it is to be understood that various changes, substitutions, and alterations can be made therein without departing from the spirit and scope of the invention as defined by the appended claims.

What is claimed is:

1. A method of forming a semiconductor integrated circuit of the type having a plurality of circuit components located on and in a semiconductor substrate, a first insulating layer on one surface of said substrate having apertures therein selectively exposing portions of said circuit components, and a first metal interconnection system on said first insulating layer making electrical connection to certain of said circuit components through said apertures in said first insulating layer, comprising the steps of:

(a) depositing a first individual layer of an insulating compound of a semiconductor on said first insulating layer and said metal contact system by a non-oxidizing deposition method, said first individual layer having a preselected chemical composition and preselected chemical and physical properties, and (b) depositing a second individual layer of an insulating compound of a semiconductor on said first individual layer by a deposition method different from said non-oxidizing deposition method, said second individual layer having substantially the same chemical composition as said first individual layer but dissimilar chemical and physical properties.

2. The method as defined by claim 1, wherein said first individual layer is formed by RF sputtering, and said second individual layer is formed by the oxidative reaction of a silicon compound and oxygen.

3. The method as defined by claim 1, wherein said first and second individual layers are silicon oxide.

4. The method as defined by claim 1, including the step of forming a second metal interconnection system on said second individual layer, said second metal interconnection system making selective electrical contact to said first metal interconnection system through apertures in said first and second individual layers.

5. A method as defined in claim 4 wherein said non-oxidizing deposition method is a low pressure method.

6. The method as defined in claim 5 wherein said first and second individual layers are silicon oxide.

7. The method as defined in claim 5 wherein said first and second deposition methods are non-oxidizing and oxidizing methods, respectively.

References Cited

UNITED STATES PATENTS

| | | | |
|---|---|---|---|
| 3,424,661 | 1/1969 | Andrushuk et al. | 204—164 |
| 3,450,581 | 6/1964 | Shortes | 204—192 |
| 2,905,600 | 9/1959 | Franklin | 204—58 |
| 3,432,417 | 3/1969 | Davidse et al. | 204—192 |

FOREIGN PATENTS

| | | | |
|---|---|---|---|
| 1,438,826 | 4/1966 | France | 204—192 |

OTHER REFERENCES

Davidse, "Theory and Practice of RF Sputtering," Vacuum, vol. 17, No. 3, November 1966, pp. 139–145.

Ing Jr. et al., J. of the Electrochem. Soc., vol. 112, No. 3, p. 284–8, March 1965.

JOHN H. MACK, Primary Examiner

S. S. KANTER, Assistant Examiner